(12) United States Patent
Tanimoto

(10) Patent No.: US 9,531,329 B2
(45) Date of Patent: Dec. 27, 2016

(54) POWER AMPLIFIER AND TRANSMISSION APPARATUS

(71) Applicant: NEC Corporation, Minato-ku, Tokyo (JP)

(72) Inventor: Takuya Tanimoto, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 14/910,746

(22) PCT Filed: Sep. 12, 2013

(86) PCT No.: PCT/JP2013/005409
§ 371 (c)(1),
(2) Date: Feb. 8, 2016

(87) PCT Pub. No.: WO2015/037033
PCT Pub. Date: Mar. 19, 2015

(65) Prior Publication Data
US 2016/0197584 A1    Jul. 7, 2016

(51) Int. Cl.
*H04B 1/04* (2006.01)
*H03F 1/02* (2006.01)
*H03F 3/189* (2006.01)
*H03F 3/24* (2006.01)
*H03F 3/21* (2006.01)
(Continued)

(52) U.S. Cl.
CPC ............ *H03F 1/0288* (2013.01); *H03F 3/189* (2013.01); *H03F 3/19* (2013.01); *H03F 3/211* (2013.01); *H03F 3/24* (2013.01); *H03F 3/245* (2013.01); *H03H 7/38* (2013.01); *H04B 3/06* (2013.01); *H03F 2200/192* (2013.01); *H03F 2200/204* (2013.01); *H03F 2200/423* (2013.01);
(Continued)

(58) Field of Classification Search
CPC .................... H03F 2200/387; H03F 2200/451; H03F 2200/423; H03F 2200/222; H03F 2200/255
USPC ...... 455/114.3, 127.1, 127.2, 127.3, 522, 69, 455/68, 115.1, 114.2, 119, 129; 330/116, 330/123, 127
See application file for complete search history.

(56) References Cited

U.S. PATENT DOCUMENTS

2012/0188010 A1* 7/2012 Wakejima ................ H01P 5/10
330/116

FOREIGN PATENT DOCUMENTS

JP    S56-147628 U    11/1981
JP    2005-341048 A   12/2005
(Continued)

OTHER PUBLICATIONS

International Search Report for PCT Application No. PCT/JP2013/005409, mailed on Dec. 17, 2013.

*Primary Examiner* — Keith Ferguson

(57) ABSTRACT

A power amplifier according to the present invention includes: an apparatus housing (10) having a hole (11) for maintenance formed therein; a transmission line unit (12) disposed in a location covered by the apparatus housing (10), a transmission line length of the transmission line unit being adjusted depending on a frequency band of an input signal; and an element (13) that requires no adjustment of a transmission line even when an adjustment of the transmission line unit (12) is required along with a change in the frequency band of the input signal. The transmission line unit (12) is disposed near a surface of an apparatus that is accessible from outside through the hole (11) for maintenance, and the element (13) that requires no adjustment of the transmission line is buried in a location within the
(Continued)

apparatus housing that is inaccessible through the hole for maintenance (11).

8 Claims, 11 Drawing Sheets

(51) Int. Cl.
    *H03F 3/19*          (2006.01)
    *H03H 7/38*         (2006.01)
    *H04B 3/06*         (2006.01)

(52) U.S. Cl.
    CPC ............... *H03F 2200/451* (2013.01); *H03F 2203/21142* (2013.01)

(56) References Cited

FOREIGN PATENT DOCUMENTS

| | | |
|---|---|---|
| JP | 2007-019578 A | 1/2007 |
| JP | 2012-114711 A | 6/2012 |
| JP | 2013-172174 A | 9/2013 |

\* cited by examiner

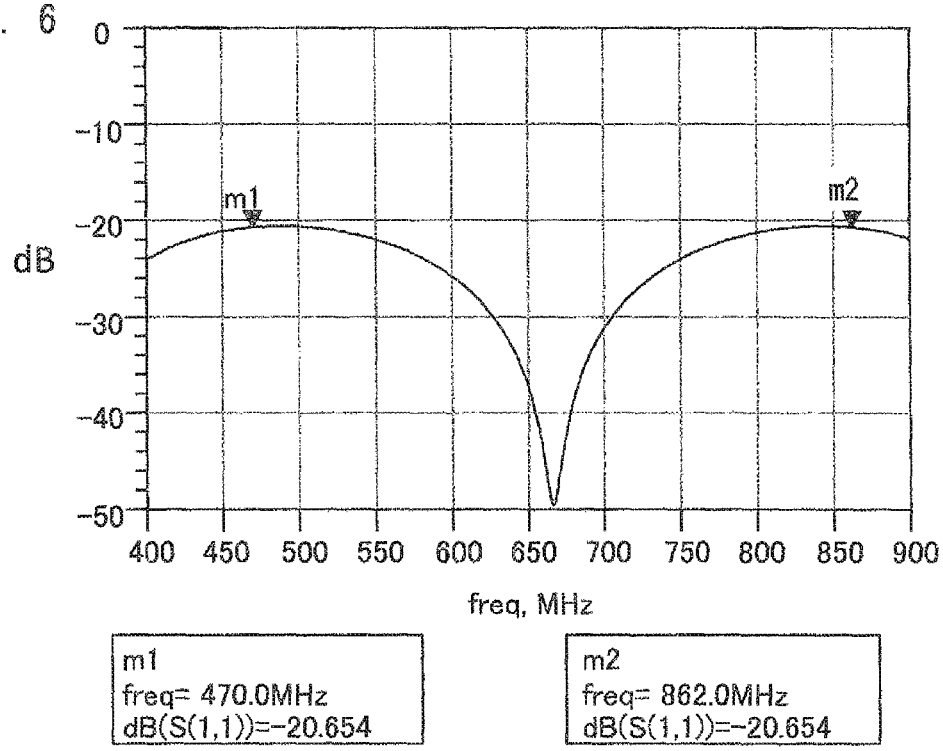
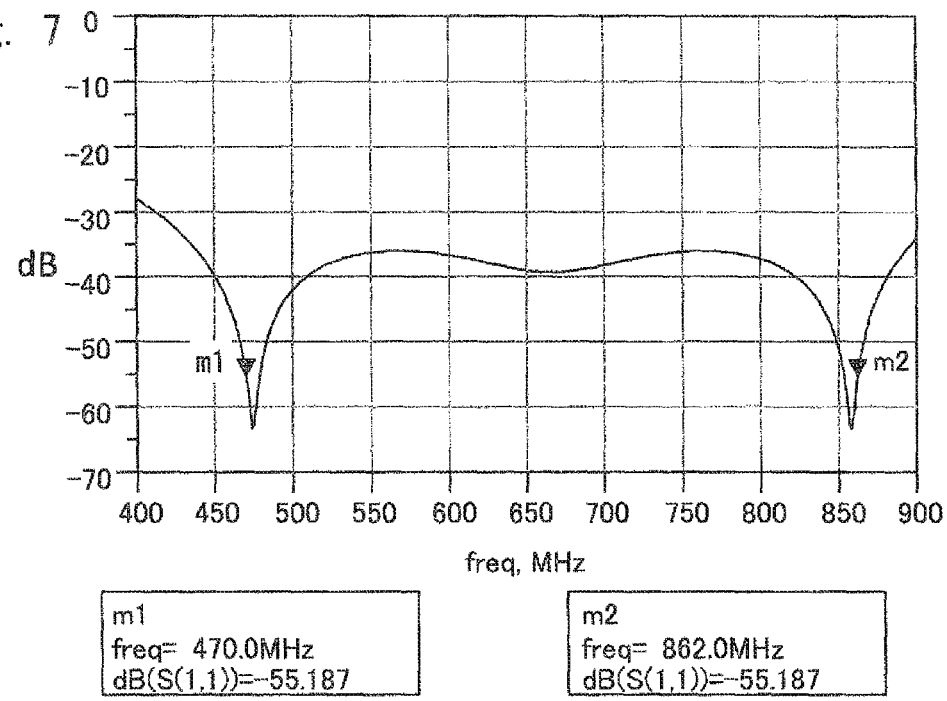

POWER AMPLIFIER AND TRANSMISSION APPARATUS

This application is a National Stage Entry of PCT/JP2013/005409 filed on Sep. 12, 2013, the contents of all of which are incorporated herein by reference, in their entirety.

TECHNICAL FIELD

The present invention relates to a power amplifier and a transmission apparatus, and more particularly, to a power amplifier and a transmission apparatus which amplify signals in different frequency bands.

BACKGROUND ART

In a transmission apparatus, such as a base station, which transmits signals to mobile phone units, a Doherty amplifier is used as an amplifier to efficiently amplify the signals. When the Doherty amplifier receives a low-level signal, a main amplifier having characteristics, such as a class AB, operates, and when the Doherty amplifier receives a high-level signal, not only the main amplifier, but also a peak amplifier having characteristics, such as a class C, operates. Thus, highly-efficient signal amplification is achieved by controlling the amplifiers that operate depending on the level of the input signal.

A configuration example of a general Doherty amplifier will be described with reference to FIG. 12. The general Doherty amplifier distributes input signals and outputs the distributed signals to a main amplifier 110 and a peak amplifier 112. The signal input to the main amplifier 110 is amplified by the main amplifier 110, and is transmitted through an adjustment line 111. The signal input to the peak amplifier 112 is amplified by the peak amplifier 112, and is transmitted through an adjustment line 113. The signals transmitted through the adjustment line 111 and the adjustment line 113, respectively, are synthesized, and the synthesized signal is transmitted through an adjustment line 114. An adjustment line 115 is disposed at the preceding stage of the main amplifiers 110 and an adjustment line 116 is disposed at the preceding stage of the main amplifier 112 so as to match the phases of the signals in the synthesizing part.

The Doherty amplifier can amplify a signal having a predetermined frequency with high efficiency by adjusting the electrical length of each of the adjustment lines 111, 113, and 114. In this case, the electrical length is represented by a phase. The electrical length may be represented as, for example, 90 degrees. For example, an electrical length of 90 degrees indicates a 90-degree phase shift of a signal. The phase can also be represented by a wavelength λ. For example, a phase shift of λ/4 indicates a 90-degree phase shift.

For example, in the case of matching the output-side impedance of the adjustment line 114 to 50Ω and matching the input-side impedance of the adjustment line 114 to 25Ω, the adjustment line 114 having an electrical length of 90 degrees at 666 MHz and having a characteristic impedance of 35.5Ω is used. In this case, as shown in FIG. 13, assuming that a frequency band with a return loss characteristic of −30 dB or less is an effective band, the effective band is about 630 MHz to 700 MHz when the adjustment line 114 is used.

The electrical length of each of the adjustment line 111 and the adjustment line 113 is adjusted so that signals having a frequency ranging from 630 MHz to 700 MHz can be transmitted with high efficiency.

Thus, the Doherty amplifier which amplifies signals in a desired frequency band with high efficiency can be operated by controlling the electrical length of each of the adjustment lines 111, 113, and 114.

Further, Patent Literature 1 discloses the configuration of a Doherty amplifier in which an output unit of a carrier amplifier (main amplifier) and an output unit of a peak amplifier are linearly arranged so that they are opposed to each other.

CITATION LIST

Patent Literature

[Patent Literature 1] Japanese Unexamined Patent Application Publication No. 2012-114711

SUMMARY OF INVENTION

Technical Problem

In the case of using a Doherty amplifier, it is necessary to adjust the electrical length of each of the adjustment lines 111, 113, and 114 shown in FIG. 12 when the frequency band of the signal to be amplified is changed. Accordingly, when an amplifying apparatus including a Doherty amplifier is used in a wide frequency band, there is a problem that it is necessary to adjust the adjustment lines, or to replace the adjustment lines with other adjustment lines. Further, when the frequency band of the signal to be amplified is frequently changed, there is also a problem that a load associated with maintenance work for adjustment of the adjustment lines increases.

An object of the present invention is to provide an amplifying apparatus capable of reducing a maintenance work load so as to solve the above-mentioned problem.

Solution to Problem

A power amplifier according to a first exemplary aspect of the present invention includes: an apparatus housing having a hole for maintenance formed therein; a transmission line unit disposed in a location covered by the apparatus housing, a transmission line length of the transmission line unit being adjusted depending on a frequency band of an input signal; and an element that requires no adjustment of a transmission line even when an adjustment of the transmission line unit is required along with a change in the frequency band of the input signal. The transmission line unit is disposed near a surface of an apparatus that is accessible from an outside through the hole for maintenance, and the element that requires no adjustment of the transmission line is buried in a location within the apparatus housing that is inaccessible through the hole for maintenance.

A transmission apparatus according to a second exemplary aspect of the present invention includes: a signal generation unit that generates an input signal at any frequency; an apparatus housing having a hole for maintenance formed therein; a transmission line unit disposed in a location covered by the apparatus housing, a transmission line length of the transmission line unit being adjusted depending on a frequency band of the input signal; an element that requires no adjustment of a transmission line even when an adjustment of the transmission line unit is required along with a change in the frequency band of the input signal; and a transmission unit that transmits, to an opposite apparatus, signals output from the transmission line unit and the element that requires no adjustment of the transmission line. The transmission line unit is disposed near a surface of an apparatus that is accessible from an outside through the hole for maintenance, and the element that requires no adjustment of the transmission line is buried in a location within the apparatus housing that is inaccessible through the hole for maintenance.

Advantageous Effects of Invention

According to the present invention, it is possible to provide a power amplifier and a transmission apparatus which are capable of reducing a maintenance work load.

BRIEF DESCRIPTION OF DRAWINGS

FIG. 6 is a graph for explaining a usable frequency band when the impedance transformation unit according to the third exemplary embodiment is used;

FIG. 7 is a graph for explaining a usable frequency band when the impedance transformation unit according to the third exemplary embodiment is used;

DESCRIPTION OF EMBODIMENTS (First Exemplary Embodiment)

Figure 1:
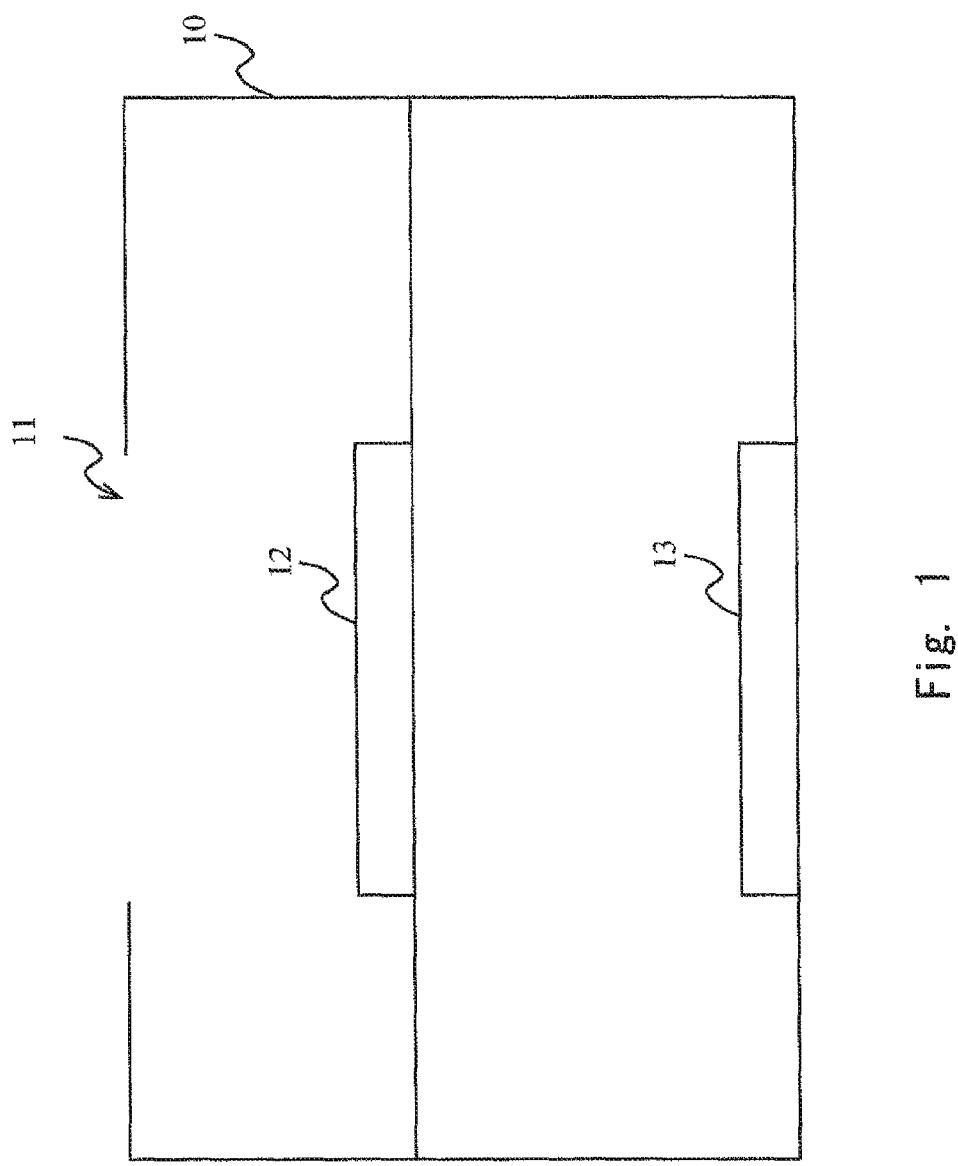
FIG. 1 is a block diagram showing a power amplifier according to a first exemplary embodiment.

Exemplary embodiments of the present invention will be described below with reference to the drawings. First, a configuration example of a power amplifier according to a first exemplary embodiment of the present invention will be described with reference to FIG. 1. The power amplifier shown in FIG. 1 is covered by an apparatus housing 10. The apparatus housing has a hole 11 for maintenance formed therein. A maintenance person or the like performs, for example, a replacement, repair, or adjustment of a circuit, a component, and the like, which are disposed in the apparatus housing 10, through the hole 11 for maintenance. This figure illustrates an example in which the hole 11 is formed in the apparatus housing 10. However, the hole 11 may be provided with a cover so as to prevent radiation noise, which is generated due to signal processing in the apparatus housing 10, from escaping to the outside of the apparatus housing 10.

The transmission line unit 12 is disposed in a location within the apparatus housing 10 that is covered by the apparatus housing 10. The transmission line length of the transmission line unit 12 is adjusted depending on the frequency band of the signal input to the power amplifier. The frequency of signals that can be amplified by the Doherty amplifier with high efficiency is determined based on the transmission line length of the transmission line unit 12. The transmission line length may also be referred to as, for example, an electrical length. Further, the transmission line unit 12 is used to transmit the signal output from the amplifier. The transmission line unit 12 may be used to shift the phase of the signal and to perform an impedance transformation. For example, a copper plate may be used for the transmission line unit 12. The use of a copper plate for the transmission line unit 12 can prevent an increase in transmission loss in comparison to a case where the transmission line unit 12 is formed with a PWB (Printed Wiring Board) pattern.

The maintenance person or the like adjusts the transmission line length of the transmission line unit 12 through the hole 11 formed in the apparatus housing. The adjustment of the transmission line length of the transmission line unit 12 may include, for example, a replacement of the transmission line unit 12 with another transmission line unit having an appropriate transmission line length.

The transmission line unit 12 is disposed near the surface of the apparatus that is accessible from the outside through the hole 11 for maintenance. In other words, the maintenance person can replace the transmission line unit 12 with another transmission line unit having a transmission line length different from that of the transmission line unit 12 through the hole 11. When the hole 11 for maintenance is provided with a cover, the maintenance person removes the cover and adjusts the transmission line length of the transmission line unit 12 through the hole 11.

The adjustment unnecessary element 13 is an element that requires no adjustment even when the transmission line length of the transmission line unit 12 is adjusted in accordance with a change in the frequency band of the signal input to the power amplifier. The adjustment unnecessary element 13 is buried in a location within the apparatus housing 10 that is inaccessible through the hole 11 for maintenance.

Examples of the location that is inaccessible through the hole 11 for maintenance include a location where, when the transmission line unit 12 is provided on a partition plate as in the case shown in FIG. 1, the buried adjustment unnecessary element 13 cannot be accessed unless the partition plate is removed.

As described above, in the power amplifier according to the first exemplary embodiment of the present invention, the transmission line unit 12 is disposed in a location that can be easily accessed through the hole 11 for maintenance formed in the apparatus housing 10. This configuration enables the maintenance person to easily adjust or replace the transmission line unit 12 through the hole 11 for maintenance formed in the apparatus housing 10. Accordingly, for example, the maintenance person can easily carry out the adjustment, replacement work, or the like regarding the transmission line unit 12, unlike in the case where the transmission line unit 12 is disposed in a location that can be accessed only after the partition plate is removed.

Furthermore, the adjustment unnecessary element 13 is disposed in a location that is inaccessible through the hole 11 for maintenance, which is advantageous in that the area of, for example, the partition plate on which the transmission line unit 12 is disposed can be reduced. In other words, the adjustment unnecessary element 13 can be disposed in a location that cannot be directly accessed through the hole 11 for maintenance, which increases the degree of freedom regarding the location where the adjustment unnecessary element 13 can be disposed. This contributes to downsizing of the apparatus housing 10.

(Second Exemplary Embodiment)

Figure 2:
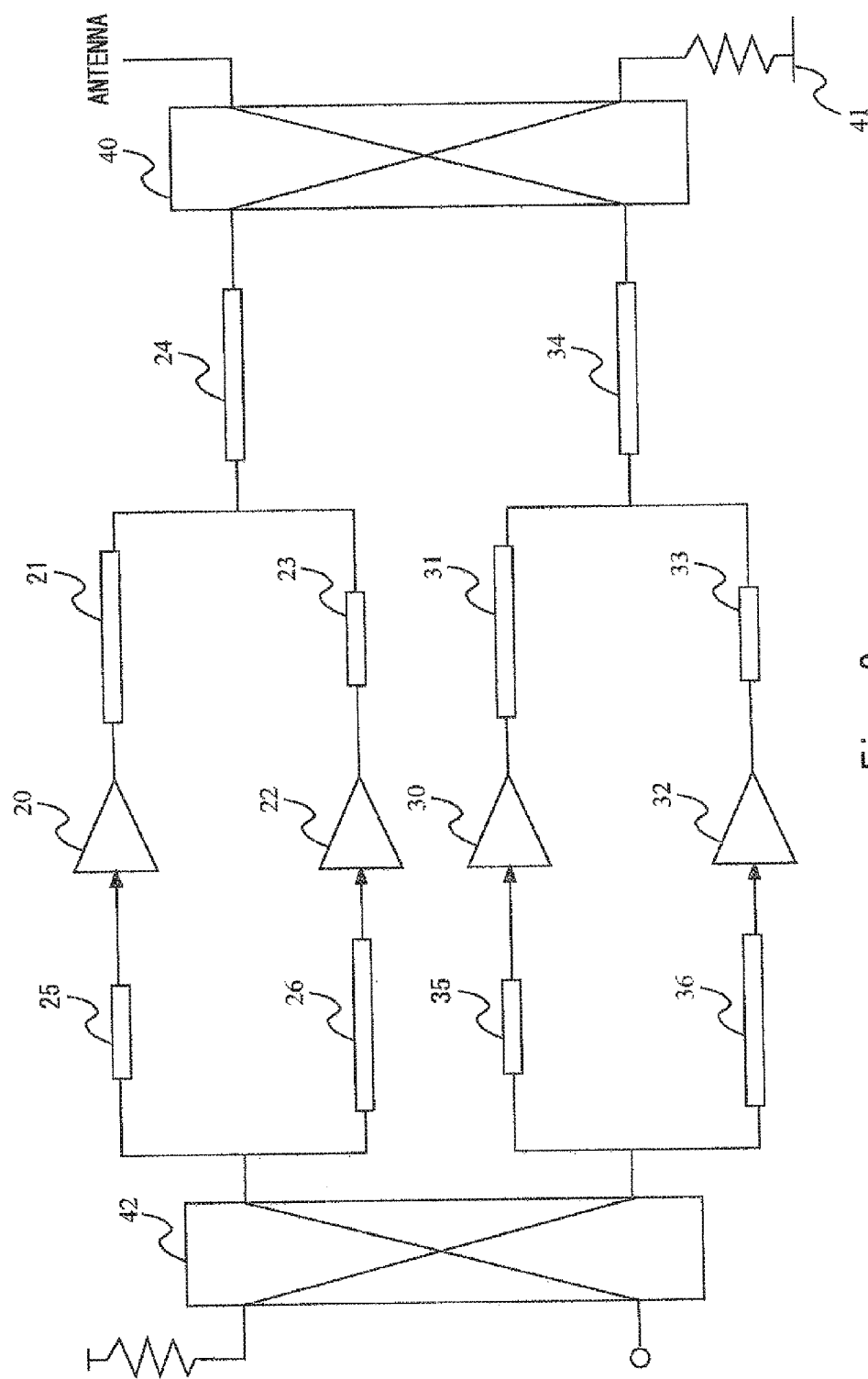
FIG. 2 is a block diagram showing a power amplifier according to a second exemplary embodiment.

Next, a configuration example of a power amplifier according to a second exemplary embodiment of the present invention will be described with reference to FIG. 2. The power amplifier shown in FIG. 2 includes a main amplifier 20, an adjustment line 21, a peak amplifier 22, an adjustment line 23, an impedance transformation unit 24, an adjustment line 25, an adjustment line 26, a main amplifier 30, an adjustment line 31, a peak amplifier 32, an adjustment line 33, an impedance transformation unit 34, an adjustment line 35, an adjustment line 36, a coupler 40, and a coupler 42. The coupler 40 is coupled to a terminator 41. The power amplifier shown in this figure is configured as a Doherty amplifier that incorporates a main amplifier and a peak amplifier. The adjustment lines 25, 26, 35, and 36 are disposed at the preceding stages of the main amplifier 20, the peak amplifier 22, the main amplifier 30, and the peak amplifier 32, respectively, so as to match the phases of the signals in the synthesizing unit of the adjustment lines 21 and 23 and the phases of the signals in the synthesizing unit of the adjustment lines 31 and 33. The input signals are distributed by the coupler 42, and are output to each of the main amplifier 20, the peak amplifier 22, the main amplifier 30, and the peak amplifier 32. For example, a 3 dB coupler is used as the coupler 42.

The main amplifier 20 amplifies the input signal. For example, a class-A, class-B, or class-AB amplifier may be used as the main amplifier 20. The main amplifier 20 transmits the amplified signal through the adjustment line 21. The signals input to the power amplifier may be, for example, so-called high-frequency signals with frequencies ranging from several hundred MHz to several GHz.

The peak amplifier 22 amplifies the input signal. For example, a class-C amplifier with high efficiency characteristics may be used as the peak amplifier 22. The peak amplifier 22 transmits the amplified signal through the adjustment line 23.

The adjustment line 21 and the adjustment line 23 correspond to the transmission line unit 12 shown in FIG. 1. A copper plate, for example, is used for the adjustment line 21 and the adjustment line 23, and the length of the copper plate is adjusted depending on the frequency band of the signal to be transmitted. For example, a copper plate having a characteristic impedance of 50Ω is used for the adjustment line 21 and the adjustment line 23. In this case, the length of each of the adjustment line 21 and the adjustment line 23 refers to the length in the same direction as the direction in which signals are transmitted, and the width of each of the adjustment line 21 and the adjustment line 23 refers to the length in the direction orthogonal to the direction in which signals transmitted.

A copper plate having an electrical length that is 90 degrees greater than the electrical length of the adjustment line 23 may be used as the adjustment line 21. In other words, the electrical length of the adjustment line 21 is set to be 90 degrees greater than the electrical length of the adjustment line 23, and the phase of the signal to be transmitted is delayed by 90 degrees. The electrical length of the adjustment line 21 is set to be 90 degrees greater than the electrical length of the adjustment line 23 for the following reason.

The peak amplifier 22 is turned on or off depending on the level of the input signal. For example, when the level of the input signal is lower than a predetermined level, the peak amplifier 22 stops operating and is turned off. Thus, when the peak amplifier 22 is turned off, it is necessary to prevent the signals output from the main amplifier 20 through the adjustment line 21 from entering the adjustment line 23 and the peak amplifier 22. In other words, when the peak amplifier 22 is turned off, all signals output from the main amplifier 20 need to be transmitted to the impedance transformation unit 24. At this time, if the electrical length of the adjustment line 23 is 90 degrees less than the electrical length of the adjustment line 21, it is possible to prevent the signals output from the main amplifier 20 from entering the adjustment line 23 and the peak amplifier 22. For this reason, the adjustment line 21 is formed with an electrical length that is 90 degrees greater than the electrical length of the adjustment line 23.

The signals transmitted through the adjustment line 21 and the adjustment line 23, respectively, are synthesized, and the synthesized signal is output to the impedance transformation unit 24.

The impedance transformation unit 24 transforms the impedance of the synthesized signal, which is obtained by synthesizing the signals output from the adjustment line 21 and the adjustment line 23, respectively, to an impedance to be applied to the signal output from the power amplifier. For example, the impedance transformation unit 24 performs an impedance transformation of the synthesized signal so that the characteristic impedance of the signal output from the power amplifier becomes 50Ω. The impedance transformation unit 24 has an electrical length of, for example, λ/4. An electrical length of λ/4 is equivalent to an electrical length of 90 degrees.

In the impedance transformation unit 24, the signal frequency at which the impedance transformation can be performed, or the frequency of signals that can be transmitted is determined in advance as in the adjustment line 21 and the adjustment line 23. The value of the characteristic impedance of the impedance transformation unit 24 will now be described.

The impedance transformation unit 24 outputs a signal with an impedance of 50Ω as the characteristic impedance of the signal that is generally output to another circuit. In this case, since the lines each having a characteristic impedance of 50Ω are connected in parallel, the impedance of the synthesizing unit of the adjustment line 21 and the adjustment line 23 is set to 25Ω.

In this case, the impedance of the impedance transformation unit 24 is calculated as a square root of 50 (Ω)×25 (Ω). That is, the characteristic impedance of the impedance transformation unit 24 is set to 35Ω.

The main amplifier 30, the adjustment line 31, the peak amplifier 32, the adjustment line 33, and the impedance transformation unit 34 have the same functions as those of the main amplifier 20, the adjustment line 21, the peak amplifier 22, the adjustment line 23, and the impedance transformation unit 24, respectively, and also have the same connection configuration. Accordingly, the detailed descriptions of the main amplifier 30, the adjustment line 31, the peak amplifier 32, the adjustment line 33, and the impedance transformation unit 34 will be omitted.

For example, a 3 dB coupler is used as the coupler 40. If the power amplifier includes a plurality of main amplifiers and a plurality of peak amplifiers, the amplified signals are finally synthesized by the coupler 40. The coupler 40 allows reflected waves, which are generated in an antenna or the like and then reach the amplifiers 20, 22, 30, and 32 and are reflected thereon, to be synthesized and absorbed at the terminator 41 by the 3 dB coupler 40, thereby preventing the generation of standing waves. Thus, adverse effects of standing waves on highly efficient operations of the main amplifiers and the peak amplifiers can be prevented.

Figure 3:
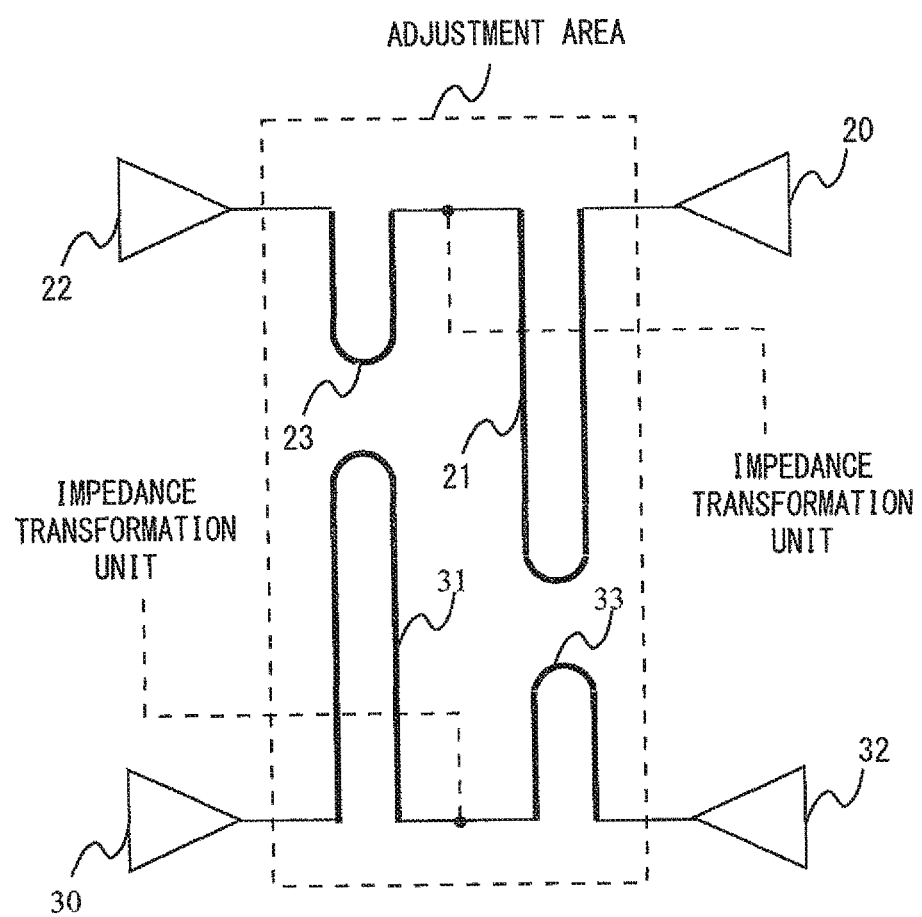
FIG. 3 is a layout diagram showing adjustment lines according to the second exemplary embodiment.

Next, specific configuration examples of the adjustment lines 21, 23, 31, and 33 according to the second exemplary embodiment of the present invention will be described with reference to FIG. 3. The adjustment lines 21, 23, 31, and 33 are formed using a copper plate. An area in which the adjustment lines 21, 23, 31, and 33 are disposed is referred to as an adjustment area. The adjustment area indicates an area in which the transmission line unit 12 shown in FIG. 1 is disposed. In other words, the maintenance person can perform the adjustment or replacement of the adjustment line, which is disposed in the adjustment area, through the hole 11 for maintenance.

This figure illustrates a configuration in which only the adjustment lines 21, 23, 31, and 33 are disposed in the adjustment area. However, the impedance transformation units 24 and 34 may also be disposed in the adjustment area. The adjustment or replacement of the electrical length of, for example, the adjustment lines or the transformation units disposed in the adjustment area enables the Doherty amplifier to amplify signals in various frequency bands.

The adjustment line 21 connected to the main amplifier 20 is formed with an electrical length that is 90 degrees greater than the electrical length of the adjustment line 23 connected to the peak amplifier 22. Further, the adjustment line 31 connected to the main amplifier 30 is formed with an electrical length that is 90 degrees greater than the electrical length of the adjustment line 33 connected to the peak amplifier 32.

The signals transmitted through the adjustment line 21 and the adjustment line 23, respectively, are output to the impedance transformation unit 24. The signals transmitted through the adjustment line 31 and the adjustment line 33, respectively, are output to the impedance transformation unit 34.

In this case, the adjustment lines 21, 23, 31, and 33 are disposed in such a manner that they do not contact each other. For example, the main amplifier 20 and the peak amplifier 22 are disposed at locations where the outputs thereof are opposed to each other, and the adjustment lines 21 and 23 are disposed between the main amplifier 20 and the peak amplifier 22. The main amplifier 30 and the peak amplifier 32 are disposed at locations where the outputs thereof are opposed to each other, and the adjustment lines 31 and 33 are disposed between the main amplifier 30 and the peak amplifier 32.

The adjustment lines 21 and 31 are disposed so as to be point-symmetric to each other with respect to a center point on a plane on which the adjustment lines are disposed. The adjustment lines 23 and 33 are also disposed so as to be point-symmetric to each other with respect to a center point on a plane on which the adjustment lines are disposed. This layout can prevent the adjustment lines 21, 23, 31, and 33 from contacting each other. Furthermore, the adjustment lines 21, 23, 31, and 33 can be efficiently disposed in a small space.

Figure 4:
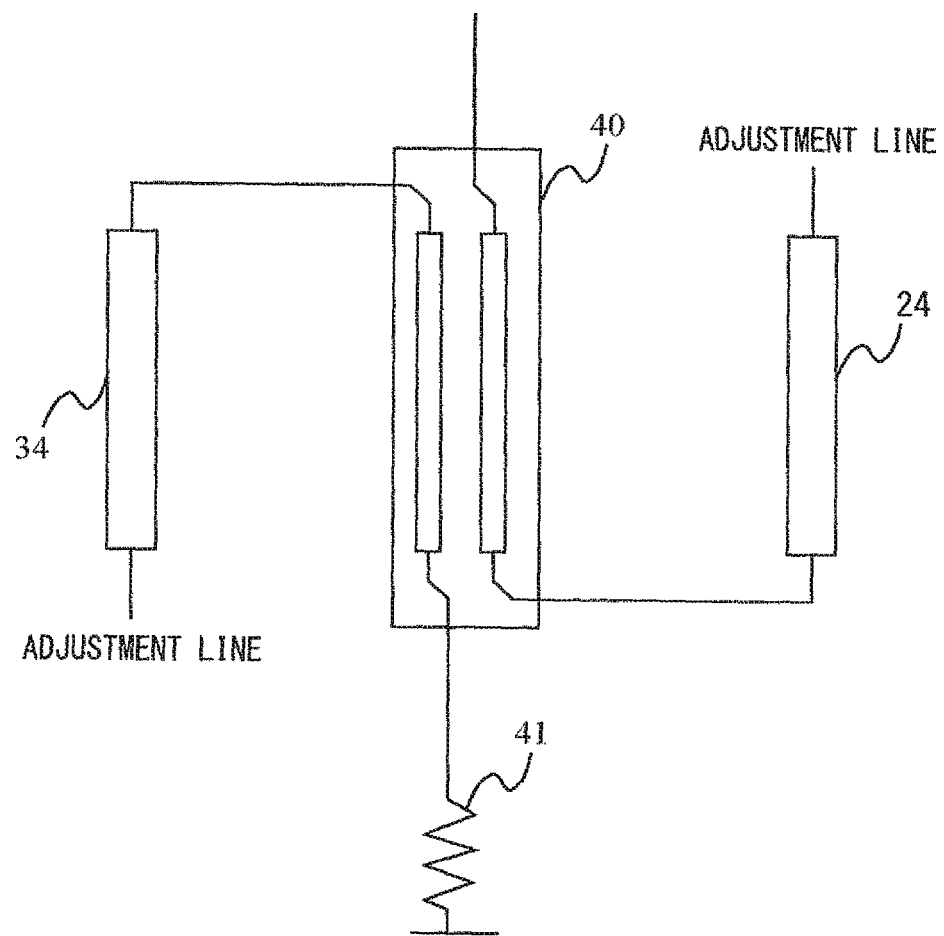
FIG. 4 is a block diagram showing an impedance transformation unit and a coupler according to the second exemplary embodiment.

Next, configuration examples of the impedance transformation unit and the coupler according to the second exemplary embodiment of the present invention will be described with reference to FIG. 4. The impedance transformation unit 24 performs an impedance transformation of the synthesized signal obtained by synthesizing the signals transmitted through the adjustment line 21 and the adjustment line 23, respectively. The impedance transformation unit 24 outputs, to the coupler 40, the signal whose impedance has been transformed. The impedance transformation unit 34 synthesizes the signals transmitted through the adjustment line 31 and the adjustment line 33, respectively, and performs an impedance transformation of the synthesized signal. The impedance transformation unit 34 outputs, to the coupler 40, the signal whose impedance has been transformed.

The coupler 40 transmits some of the signals output from the impedance transformation units 24 and 34 to an external device or the like of the power amplifier. In this case, the coupler 40 synthesizes two signals (signals having a phase difference of 90 degrees; the phase difference is determined in advance on the distribution side) which are output from the impedance transformation unit 24 and the impedance transformation unit 34, respectively, and transmits the synthesized signal to an external device or the like.

If it is necessary to adjust or replace the electrical length when the frequency band of the signal to be input to the power amplifier is changed, the impedance transformation unit 24 and the impedance transformation unit 34 are disposed in the adjustment area, as in the case of the adjustment lines 21, 23, 31, and 33.

As described above, the power amplifier according to the second exemplary embodiment of the present invention has the following advantage. That is, the impedance transformation unit and the adjustment line which require an adjustment or the like along with a change in the frequency band of the input signal are disposed in the adjustment area that can be directly accessed through the hole 11 for maintenance, thereby facilitating the maintenance work associated with a change in the frequency band of the input signal.

(Third Exemplary Embodiment)

Next, a configuration example of the impedance transformation unit 24 according to a third exemplary embodiment of the present invention will be described with reference to FIG. 5. The impedance transformation unit 24 includes impedance transformers 61 to 63. The impedance transformers 61 to 63 are connected in series between an output terminal and the synthesizing unit of the adjustment lines 21 and 23. The impedance transformation unit 34 has a configuration similar to that of the impedance transformation unit 24, and thus the detailed description thereof is omitted.

The impedance transformers 61 to 63 are transmission lines each having an electrical length of λ/4 (90 degrees). The characteristic impedances of the impedance transformers 61 to 63 are determined based on the length of the width in the direction orthogonal to the direction of the length of the electrical length.

Figure 5:
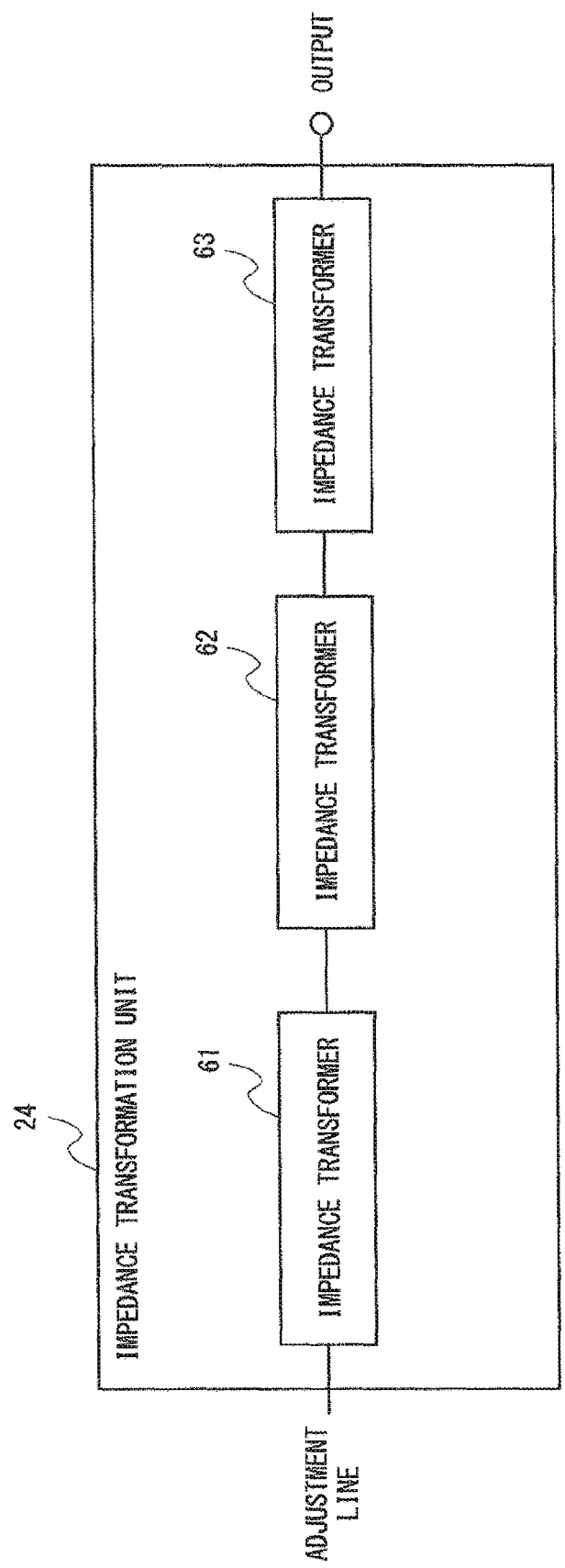
FIG. 5 is a block diagram showing an impedance transformation unit according to a third exemplary embodiment.

A change in a usable frequency band when the impedance transformation unit 17 shown in FIG. 5 is used will now be described with reference to FIG. 6. The characteristic impedances of the impedance transformers 61 to 63, for example, when the impedance at the output terminal of the Doherty amplifier is 50Ω and the impedance of the signal synthesizing unit is 25Ω will be described. The characteristic impedance at the output terminal is set to 50Ω which is generally used as the characteristic impedance of a signal to be output to another circuit. Since the lines each having a characteristic impedance of 50Ω are connected in parallel, the impedance at a signal branch point is 25Ω.

In this case, the characteristic impedance of the impedance transformer 62, which is disposed in the center of the impedance transformers 61 to 63 connected in series, is calculated as a square root of 50 (Ω)×25 (Ω). In this case, the characteristic impedance of the impedance transformer 62 is set to 35.4Ω. The characteristic impedance of the impedance transformer 61 is calculated as a square root of 25×35.4. In this case, the characteristic impedance of the impedance transformer 61 is set to 29.7Ω. The characteristic impedance of the impedance transformer 63 is calculated as a square root of 50×35.4. In this case, the characteristic impedance of the impedance transformer 63 is set to 42Ω.

In this manner, the characteristic impedances of the impedance transformers 61 to 63 are set to values that gradually increase from the impedance transformer 61 to the impedance transformer 63.

FIG. 6 shows a relationship between a frequency and a return loss characteristic when the characteristic impedances calculated as described above are set to the impedance transformers 61 to 63. As shown in FIG. 6, assuming that a region with a return loss characteristic of −30 dB or less indicates an effective band, the effective band is about 630 MHz to 700 MHz.

Referring now to FIG. 7, a change in the usable frequency band when the characteristic impedances of the impedance transformers 61 to 63 are further adjusted will be described. FIG. 7 shows a relationship between a frequency and a return loss characteristic when the characteristic impedance of the impedance transformer 61 is set to 28.2Ω; the characteristic impedance of the impedance transformer 62 is set to 35.9Ω; and the characteristic impedance of the impedance transformer 63 is set to 45.5Ω. The characteristic impedances of the respective impedance transformers may be adjusted by, for example, a simulation device.

As shown in FIG. 7, assuming that a region with a return loss characteristic of −30 dB or less indicates an effective band, the effective band is about 420 MHz to 900 MHz. Accordingly, in comparison with FIG. 6, the effective band of the impedance transformation unit 24 is expanded and broadened.

Thus, there is no need to adjust the electrical length or the like of the impedance transformers 61 to 63 constituting the impedance transformation units 24 and 34, even if the electrical length of each of the adjustment lines 21, 23, 31, and 33 is adjusted to an appropriate length, or the adjustment lines 21, 23, 31, and 33 are replaced by an adjustment line having an appropriate electrical length, when the frequency of the signal input to the Doherty amplifier is changed in, for example, the range from 420 MHz to 900 MHz along with the broadening of the frequency band of the impedance transformation unit 24.

That is, when the frequency band of the input signal is changed, the adjustment or replacement of only the adjustment lines 21, 23, 31, and 33 of the Doherty amplifier enables the Doherty amplifier to amplify, with high efficiency, the signal whose frequency is changed.

While the configuration in which three impedance transformers are connected in series is illustrated as the impedance transformation unit 17 shown in FIG. 5, the number of impedance transformers to be connected may be changed in accordance with the increased width of the effective frequency band. Three impedance transformers connected in series can cover the frequency band that is used for digital terrestrial broadcasting and the like in the UHF band.

According to the configuration in which the frequency band of the impedance transformation units 24 and 34 is broadened and there is no need to change the electrical length or the like when the frequency band of the impedance transformation units 24 and 34 is within a predetermined frequency band, the following advantageous effects can be obtained. For example, when the Doherty amplifier is disposed in the apparatus housing 10, the impedance transformation units 24 and 34 may be disposed at a location within the apparatus that cannot be easily accessed during maintenance work or the like, and the adjustment lines 21, 23, 31, and 33, which require an adjustment, replacement work, or the like, may be disposed at locations near the surface of the apparatus that can be easily accessed during maintenance work. In other words, the impedance transformation units 24 and 34 may be disposed at locations within the apparatus where the impedance transformation units 24 and 34 cannot be substantially manipulated, and the adjustment lines 21, 23, 31, and 33 may be disposed at locations where the adjustment lines 21, 23, 31, and 33 can be easily manipulated through the hole 11 for maintenance when the cover on the surface of the apparatus is removed.

This configuration increases the degree of freedom regarding the location where the impedance transformation units 24 and 34 are disposed, and facilitates the design of the apparatus including the Doherty amplifier. Further, since there is no need to dispose the impedance transformation unit 24 and the impedance transformation unit 34 in the adjustment area, the area of the adjustment area can be reduced. This configuration makes it possible to effectively utilize the space of the apparatus including the Doherty amplifier, which contributes to downsizing of the apparatus.

(Fourth Exemplary Embodiment)

Figure 8:
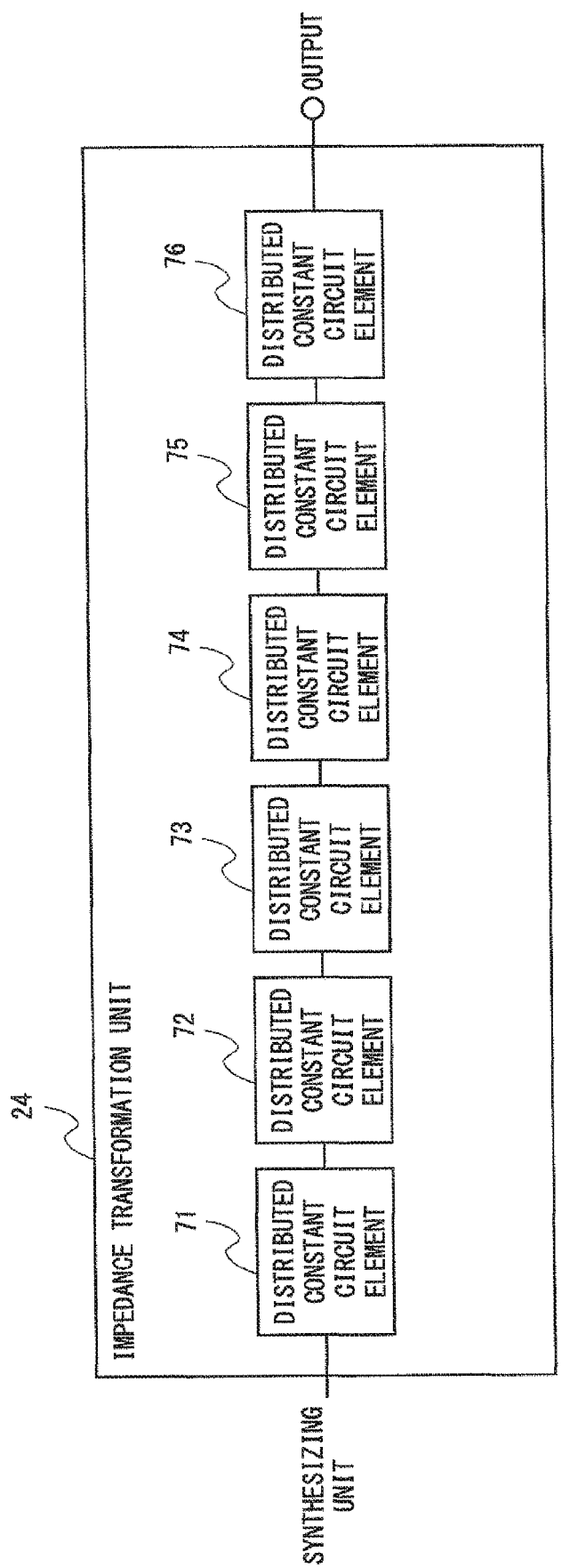
FIG. 8 is a block diagram showing an impedance transformation unit according to a fourth exemplary embodiment.

Next, a configuration example of the impedance transformation unit 24 when a distributed constant circuit is used for the impedance transformation unit 24 will be described with reference to FIG. 8. The impedance transformation unit 24 includes distributed constant circuit elements 71 to 76. This example shows that the distributed constant circuit elements 71 to 76 are connected in series, for convenience of explanation. However, the circuit elements may be, for example, transmission lines having different electrical lengths and widths, and the distributed constant circuit elements 71 to 76 may form one transmission line by connecting a plurality of transmission lines.

Since the one transmission line thus formed includes transmission lines of different widths, a transmission line having an uneven width may be used as the transmission line. One transmission line formed by connecting a plurality of distributed constant circuit elements may be formed by using a copper plate. The impedance transformation unit 34 has a configuration similar to that of the impedance transformation unit 24, and thus the detailed description thereof is omitted.

A change in the usable frequency band when the impedance transformation unit 24 shown in FIG. 8 will now be described with reference to FIG. 9. The characteristic impedances of the four impedance transformers 61 to 63, for example, when the characteristic impedance at the output terminal of the Doherty amplifier is 50Ω and the impedance of the signal synthesizing unit is 25Ω will be described.

For example, the length and width of the distributed constant circuit element 71 are set in such a manner that the distributed constant circuit element 71 has an electrical length of eight degrees at 666 MHz and a characteristic impedance of 100Ω. Similarly, the length and width of each of the distributed constant circuit elements 72 to 76 are set as follows. That is, the distributed constant circuit element 72 has an electrical length of 43 degrees at 666 MHz and a characteristic impedance of 20Ω; the distributed constant circuit element 73 has an electrical length of 19 degrees at 666 MHz and a characteristic impedance of 100Ω; the distributed constant circuit element 74 has an electrical length of 33 degrees at 666 MHz and a characteristic impedance of 20Ω; the distributed constant circuit element 75 has an electrical length of 23 degrees at 666 MHz and a characteristic impedance of 100Ω; and the distributed constant circuit element 76 has an electrical length of 13 degrees at 666 MHz and a characteristic impedance of 20Ω. By connecting these distributed constant circuit elements, one transmission line having an uneven width is formed.

Figure 9:
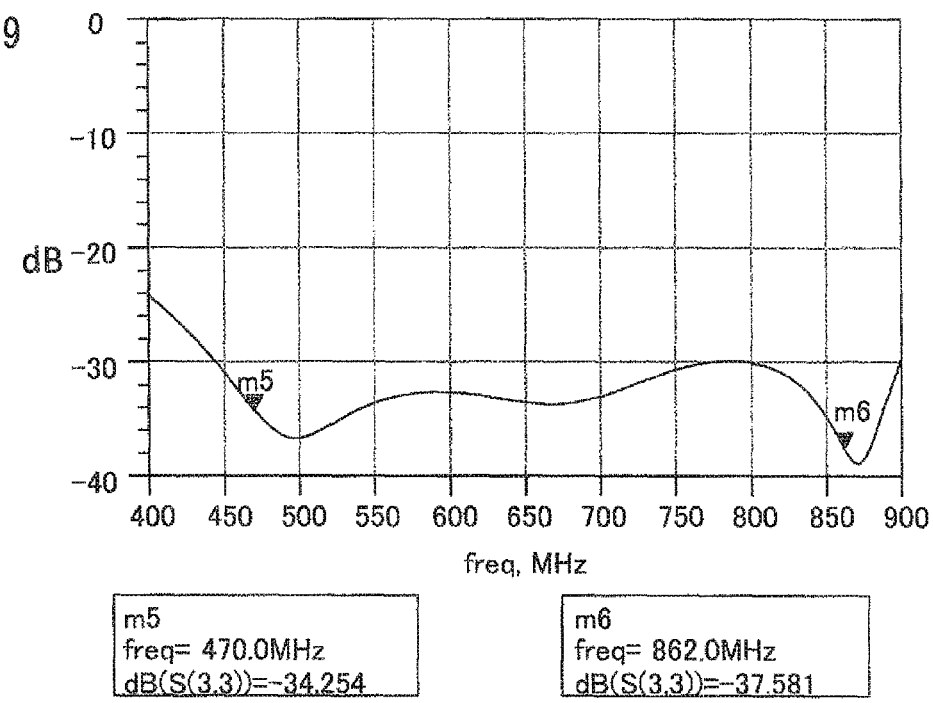
FIG. 9 is a graph for explaining a usable frequency band when the impedance transformation unit according to the fourth exemplary embodiment is used.

FIG. 9 shows a relationship between a frequency and a return loss characteristic when the electrical length and the transmission line width are set as described above. As shown in FIG. 9, assuming that a region of −30 dB or less indicates an effective band, the effective band is about 450 MHz to 900 MHz. Accordingly, when the impedance transformation unit 17 is configured using a distributed constant circuit as shown in FIG. 8, the frequency range of the impedance transformation unit 24 can be broadened. Furthermore, when the electrical length is set as described above, the electrical length of the impedance transformation unit 24 shown in FIG. 8 is 139 degrees at a frequency of 666 MHz. Thus, the electrical length of the impedance transformation unit can be shortened as compared with the impedance transformation unit 17 shown in FIG. 5 which has an electrical length of 270 degrees at a frequency of 666 MHz. This contributes to downsizing of the Doherty amplifier 10.

Figure 10:
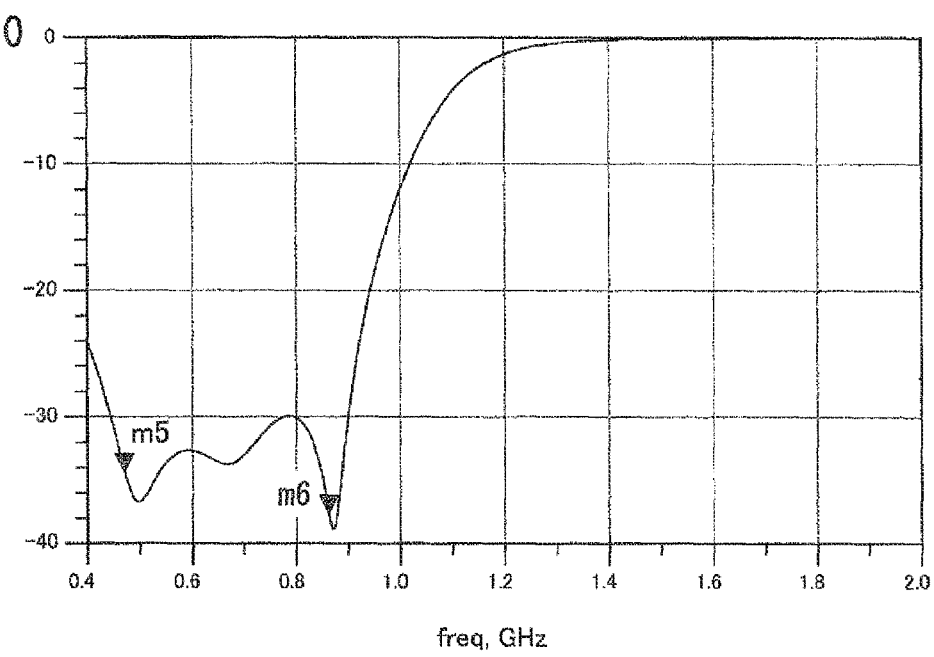
FIG. 10 is a graph for explaining a usable frequency band when the impedance transformation unit according to the fourth exemplary embodiment is used.

In addition, FIG. 10 shows a relationship between a return loss characteristic and an insertion loss characteristic when the frequency band is broadened to the level of GHz. As shown in FIG. 10, the impedance transformation unit 24, which is configured using a distributed constant circuit, also operates as a LPF (Low Pass Filter) having a pass band of about 500 MHz to 900 MHz. In other words, even when the impedance transformation unit 24 is used as the LPF, the frequency band can be broadened so as to allow signals in a predetermined frequency band to pass.

This figure illustrates the configuration of the LPF using the distributed constant circuit as a configuration example of the impedance transformation unit 24. However, the LPF having another circuit configuration may also be used. Moreover, harmonic components generated in the main amplifier 20 and the peak amplifier 22 can be removed by causing the impedance transformation unit 24 to operate as the LPF.

(Fifth Exemplary Embodiment)

Figure 11:
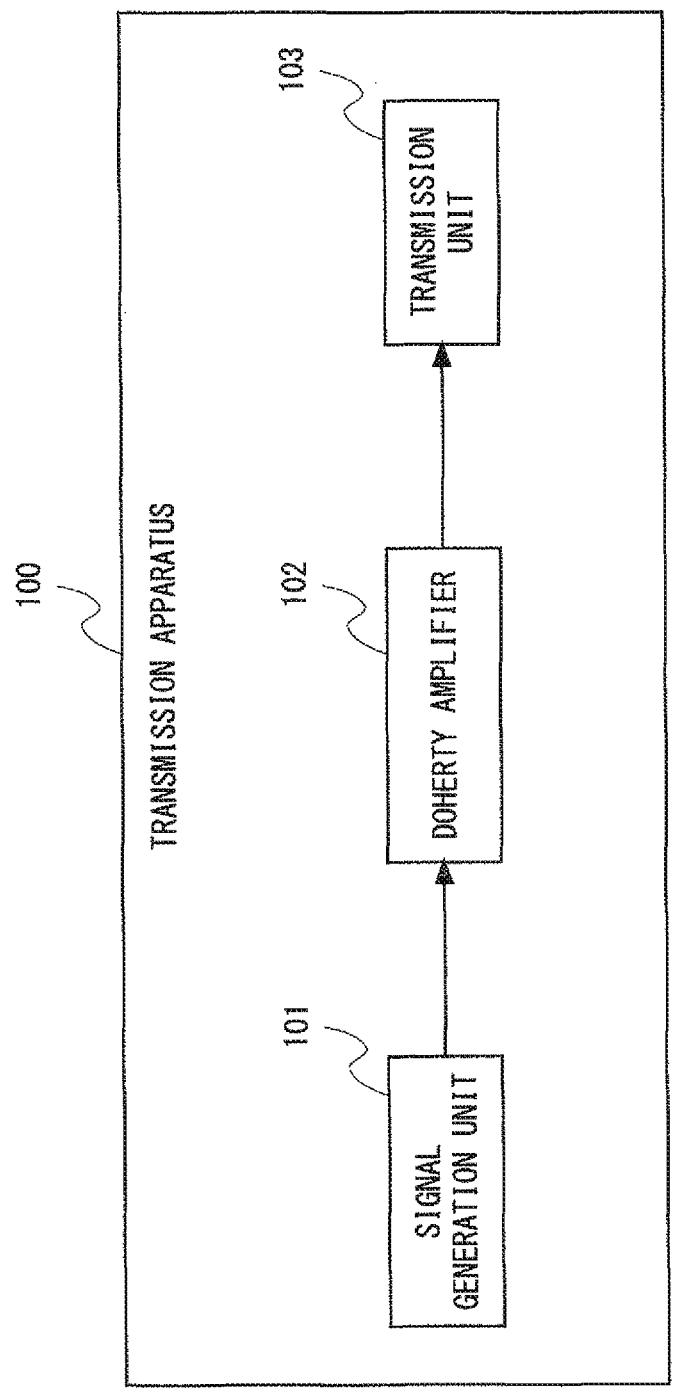
FIG. 11 is a block diagram showing a transmission apparatus according to a fifth exemplary embodiment.
Figure 12:
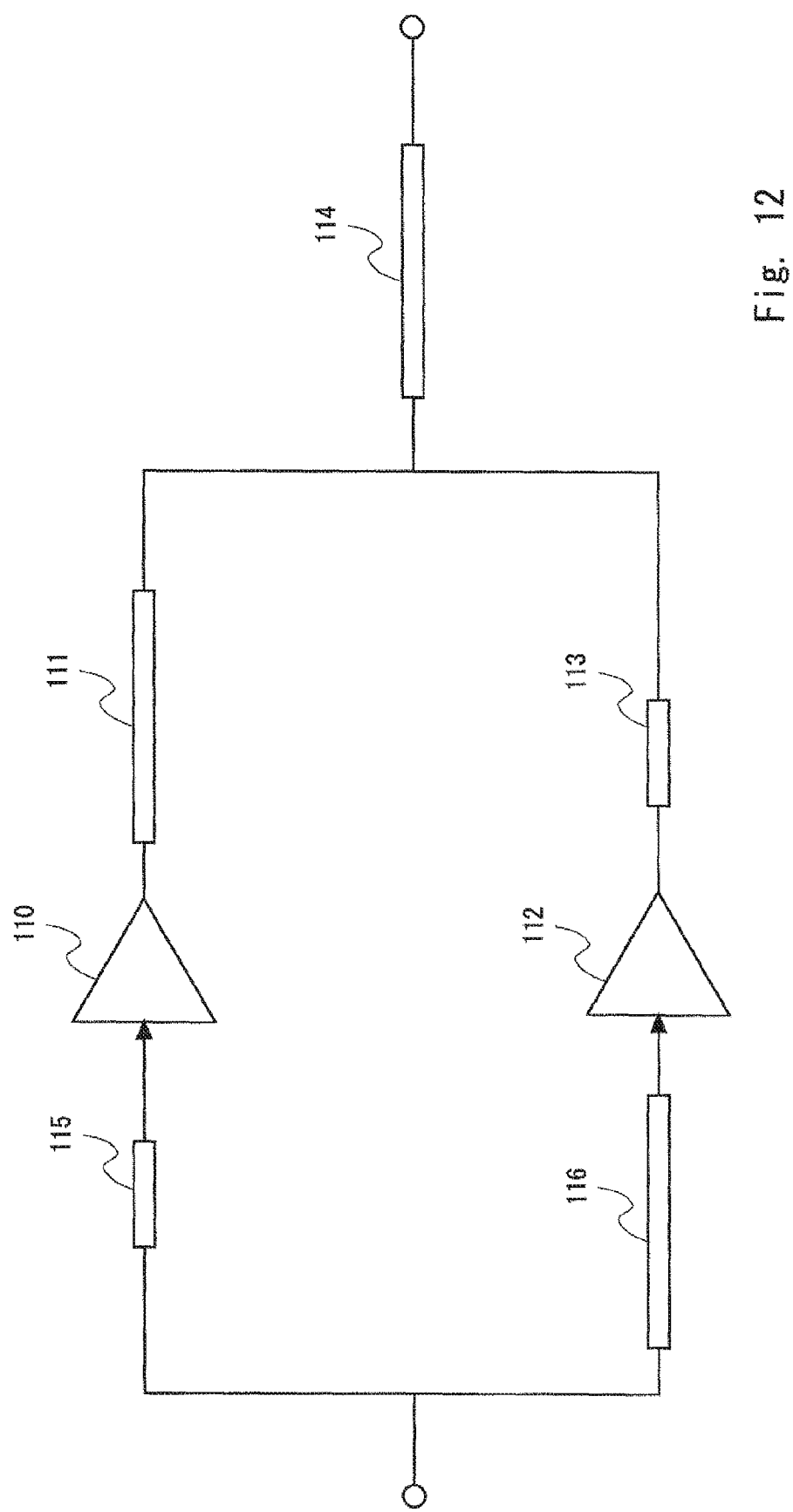
FIG. 12 is a block diagram showing a general Doherty amplifier.
Figure 13:
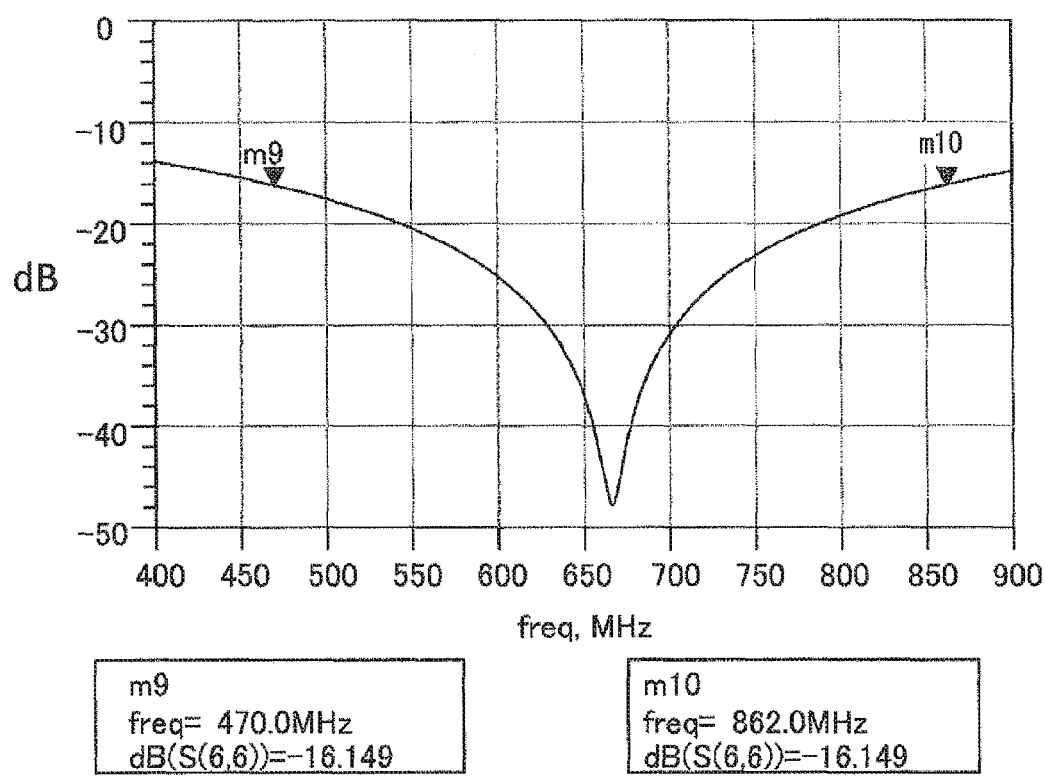
FIG. 13 is a graph for explaining a usable frequency band when the general Doherty amplifier is used.

Next, a configuration example of a transmission apparatus 100 according to a fifth exemplary embodiment of the present invention will be described with reference to FIG. 11. The transmission apparatus 100 may be, for example, a broadcasting transmission apparatus for example, a broadcasting communication apparatus compatible with multiple-channel communication, or a base station apparatus. The transmission apparatus 100 is not limited to a broadcasting communication apparatus, a base station apparatus, or the like, and may be a communication apparatus with a wide usable frequency band.

The transmission apparatus 100 includes a signal generation unit 101, a Doherty amplifier 102, and a transmission unit 103. The Doherty amplifier 102 is similar to the Doherty amplifier described above with reference to FIG. 2. Accordingly, the detailed description of the Doherty amplifier 102 is omitted.

The signal generation unit 101 generates a radio frequency (RF) signal. The signal generation unit 101 outputs the generated RF signal to the Doherty amplifier 102. In this case, the signal generation unit 101 may generate the RF signal at any frequency. For example, the signal generation unit 101 may change the frequency band of the generated RF signal when a channel of a different usable frequency band is set.

The frequency band that can be generated by the signal generation unit 101 may be determined depending on the frequency band of the signal that can be amplified by the Doherty amplifier 102. For example, when the usable frequency band is changed upon replacement of the transmission line unit in the Doherty amplifier 102, the signal generation unit 101 may also generate the RF signal in the changed frequency band.

The signal generation unit 101 may generate RF signals in a plurality of frequency bands. If the transmission apparatus 100 includes a plurality of signal generation units 101, the signal generation unit 101 to be used may be switched in accordance with a change in the frequency band of the RF signal.

The Doherty amplifier 102 amplifies the RF signal output from the signal generation unit 101. The Doherty amplifier 102 outputs the amplified RF signal to the transmission unit 103. The transmission unit 103 transmits the RF signal output from the Doherty amplifier 102 to another transmission apparatus which is different from the transmission apparatus 100.

As described above, the Doherty amplifier 102 is disposed in, for example, the transmission apparatus 100, and is used to amplify the RF signal to be processed by the transmission apparatus 100. At this time, the adjustment or replacement of the transmission line units in the Doherty amplifier 102 enables the transmission apparatus 100 to transmit RF signals in various frequency bands.

Note that the present invention is not limited to the above exemplary embodiments, and can be modified as appropriate without departing from the scope of the invention.

REFERENCE SIGNS LIST

10 APPARATUS HOUSING
11 HOLE
12 TRANSMISSION LINE UNIT
13 ADJUSTMENT UNNECESSARY ELEMENT
20 MAIN AMPLIFIER
21 ADJUSTMENT LINE
22 PEAK AMPLIFIER
23 ADJUSTMENT LINE
24 IMPEDANCE TRANSFORMATION UNIT
25 ADJUSTMENT LINE
26 ADJUSTMENT LINE
30 MAIN AMPLIFIER
31 ADJUSTMENT LINE
32 PEAK AMPLIFIER
33 ADJUSTMENT LINE
34 IMPEDANCE TRANSFORMATION UNIT
35 ADJUSTMENT LINE
36 ADJUSTMENT LINE
40 COUPLER
41 TERMINATOR
42 COUPLER
61-63 IMPEDANCE TRANSFORMER
71-76 DISTRIBUTED CONSTANT CIRCUIT ELEMENT
100 TRANSMISSION APPARATUS
101 SIGNAL GENERATION UNIT
102 DOHERTY AMPLIFIER
103 TRANSMISSION UNIT

What is claimed is:

1. A power amplifier comprising:
   an apparatus housing having a hole for maintenance formed therein;
   a transmission line unit disposed in a location covered by the apparatus housing, a transmission line length of the transmission line unit being adjusted depending on a frequency band of an input signal; and
   an element that requires no adjustment of a transmission line even when an adjustment of the transmission line unit is required along with a change in the frequency band of the input signal,
   wherein the transmission line unit is disposed near a surface of an apparatus that is accessible from an outside through the hole for maintenance, and the element that requires no adjustment of the transmission line is buried in a location within the apparatus housing that is inaccessible through the hole for maintenance.

2. The power amplifier according to claim 1, wherein the transmission line unit transmits signals output from a main amplifier and a peak amplifier, respectively, the main amplifier and the peak amplifier constituting a Doherty amplifier.

3. The power amplifier according to claim 2, further comprising an impedance transformation unit that performs an impedance transformation of a synthesized signal obtained by synthesizing a signal output from the main amplifier and a signal output from the peak amplifier,
   wherein the impedance transformation unit includes a plurality of λ/4 transmission lines connected in series.

4. The power amplifier according to claim 3, wherein the transmission line unit includes:
   a first transmission line unit that transmits a signal output from a first main amplifier;
   a second transmission line unit that transmits a signal output from a first peak amplifier;
   a third transmission line unit that transmits a signal output from a second main amplifier; and
   a fourth transmission line unit that transmits a signal output from a second peak amplifier, and
   the impedance transformation unit includes:
   a first impedance transformation unit that performs an impedance transformation of a first synthesized signal obtained by synthesizing signals transmitted through the first transmission line unit and the second transmission line unit, respectively; and
   a second impedance transformation unit that performs an impedance transformation of a second synthesized signal obtained by synthesizing signals transmitted through the third transmission line unit and the fourth transmission line unit, respectively.

5. The power amplifier according to claim 4, wherein
   each of the first to fourth transmission line units is a copper plate, and
   the first transmission line unit is formed with an electrical length that is 90 degrees greater than the electrical length of the second transmission line unit, and the third transmission line unit is formed with an electrical length that is 90 degrees greater than the electrical length of the fourth transmission line unit.

6. The power amplifier according to claim 5, wherein
   the first to fourth transmission line units are disposed on the same plane,
   the first transmission line unit is disposed in a location that is point-symmetric to the third transmission line unit with respect to a center point on the flat surface,
   the second transmission line unit is disposed in a location that is point-symmetric to the fourth transmission line unit with respect to the center point, and
   the first to fourth transmission line units are disposed in locations which are not in contact with each other.

7. The power amplifier according to claim 4, further comprising a coupler that synthesizes signals output from the first impedance transformation unit and the second impedance transformation unit, respectively,
   wherein the coupler is buried in a location within the apparatus housing that is inaccessible through the hole for maintenance.

8. A transmission apparatus comprising:
   a signal generation unit that generates an input signal at any frequency;
   an apparatus housing having a hole for maintenance formed therein;
   a transmission line unit disposed in a location covered by the apparatus housing, a transmission line length of the transmission line unit being adjusted depending on a frequency band of the input signal;
   an element that requires no adjustment of a transmission line even when an adjustment of the transmission line unit is required along with a change in the frequency band of the input signal; and
   a transmission unit that transmits signals output from the transmission line unit and the element that requires no adjustment of the transmission line,
   wherein the transmission line unit is disposed near a surface of an apparatus that is accessible from an outside through the hole for maintenance, and the element that requires no adjustment of the transmission line is buried in a location within the apparatus housing that is inaccessible through the hole for maintenance.

* * * * *